United States Patent [19]

Kinsner et al.

[11] 4,059,829
[45] Nov. 22, 1977

[54] MULTI STATE MAGNETIC BUBBLE DOMAIN CELL FOR RANDOM ACCESS MEMORIES

[75] Inventors: Witold Kinsner, Hamilton; Edward Della Torre, Toronto, both of Canada

[73] Assignee: Canadian Patents and Development Limited, Ottawa, Canada

[21] Appl. No.: 632,803

[22] Filed: Nov. 17, 1975

[51] Int. Cl.² ............................................. G11C 11/14
[52] U.S. Cl. ........................................ 365/19; 365/34; 365/36; 365/40
[58] Field of Search ................................ 340/174 TF

[56] References Cited

U.S. PATENT DOCUMENTS

| | | | |
|---|---|---|---|
| 3,513,452 | 5/1970 | Bobeck et al. | 340/179 TF |
| 3,715,736 | 2/1973 | O'Donnell et al. | 340/174 TF |
| 3,717,853 | 2/1973 | O'Donnell et al. | 340/174 TF |

Primary Examiner—James W. Moffitt
Attorney, Agent, or Firm—Edward Rymek

[57] ABSTRACT

A multi-state memory cell which uses magnetic bubble domains in uniaxial material is described. The cell includes a channel in which a number of stable bubble positions separated by barriers is formed and on which select conductors are positioned to switch a bubble from one stable position to another on a threshold basis by means of coincident currents. A cell in accordance with this invention may take the form of a four-state-two conductor cell, two-bistable-state two-conductor cell, multi-state six conductor cell and six-state three-conductor cell and include destructive or non-destructive readout.

17 Claims, 37 Drawing Figures

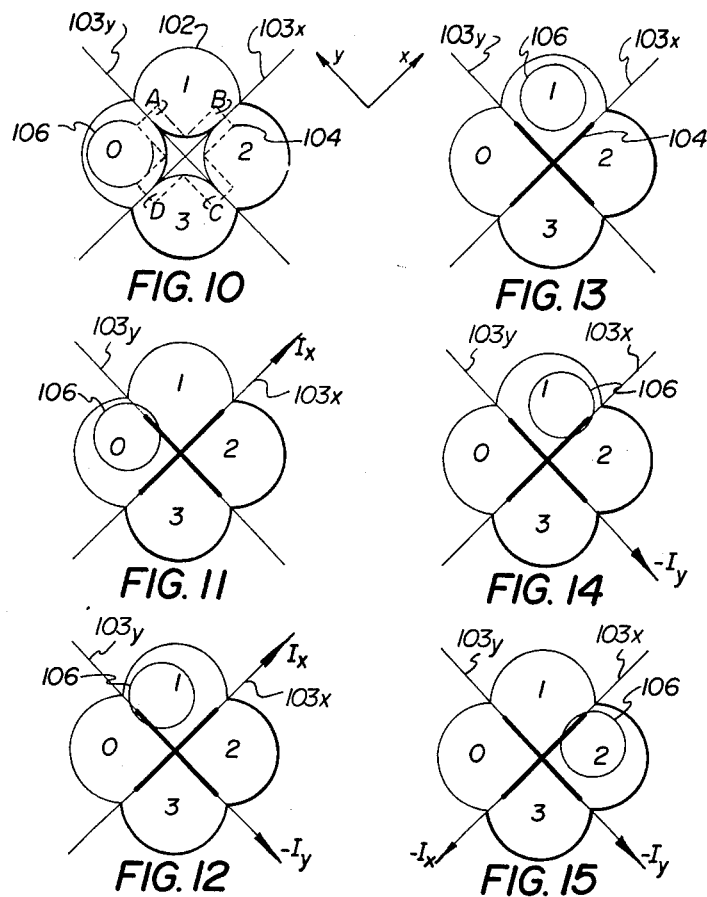
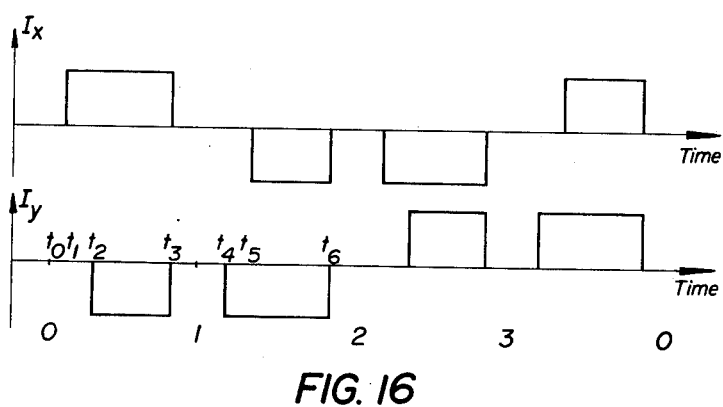

MULTI STATE MAGNETIC BUBBLE DOMAIN CELL FOR RANDOM ACCESS MEMORIES

This invention is directed to a multi-state memory cell which uses magnetic bubble domain uniaxial magnetic materials, and which may be used in a random access memory.

A bubble memory element is disclosed in U.S. Pat. No. 3,513,452 which issued on May 19, 1970 to A. H. Bobeck, E. Della Torre and A. A. Thiele, assignors to Bell Telephone Laboratories, Incorporated. This element, which operates on a threshold basis has an artificial impedance to domain propagation that is created by a magnetic material arranged to form a figure eight or constricted annulus pattern. There are only two stable positions within the element between which a bubble may be moved by means of field gradients generated by select electric currents in two wires arranged to intersect at the barrier between the two positions. The electrical read-out operation for the element is inherently destructive unless two additional wires are incorporated within the element.

The nature of present binary computers is dictated by the two-valued nature of switching primitives, which make up the machines, especially the RAM's. Although current trends indicate a rapid increase in proposed multiple-valued logic electronic devices such as R-flops i.e. circuits having R stable states, for building or registers, shift-registers, counters, etc., a true multi-valued memory element does not exist.

It is therefore an object of this invention to provide such a multi-state bubble domain memory cell.

It is another object of this invention to provide a multi-state bubble memory cell which operates on a threshold basis.

It is a further object of this invention to provide a multi-state bubble memory cell in which states can be changed by the application of coincident currents.

It is another object of this invention to provide a multi-state bubble memory cell having high bubble stability.

It is a further object of this invention to provide a multi-state bubble memory cell having a limited number of select conductors to control a large storage capacity.

It is another object of this invention to provide a multi-state bubble memory cell capable of non-destructive readout.

It is a further object of this invention to provide a multi-state bubble memory cell which can be reproduced in an array forming a random access memory unit having a high packing density.

It is another object of this invention to provide a two-bistable cell driven by only two select currents, one in the x-direction and one in the y-direction.

These and other objects are achieved in a multi-state magnetic bubble domain memory cell wherein a channel consisting of a number of discrete energy minima positions separated by barriers, is formed in a bubble supporting material to provide stable magnetic bubble domain positions. The cell further includes switching means for each pair of adjacent stable positions which consists of a first select current conductor that is positioned over the barrier between the two stable positions and a second select conductor which is positioned adjacent to the two stable positions for conducting predetermined coincident currents to produce a magnetic field in the cell for switching a magnetic bubble across the barrier.

For use in a memory, the state of the cell would be determined by sensors that sense the location of bubbles at either all the various stable positions or selected positions in the cell. To enhance the switching and stability, a thin film soft magnetic material between may be positioned on the bubble supporting material over a cell such that it will be magnetized by the currents in the conductors.

In the drawings:

FIGS. 7 to 16 illustrate the principles of operation of the cell;

Figure 1:
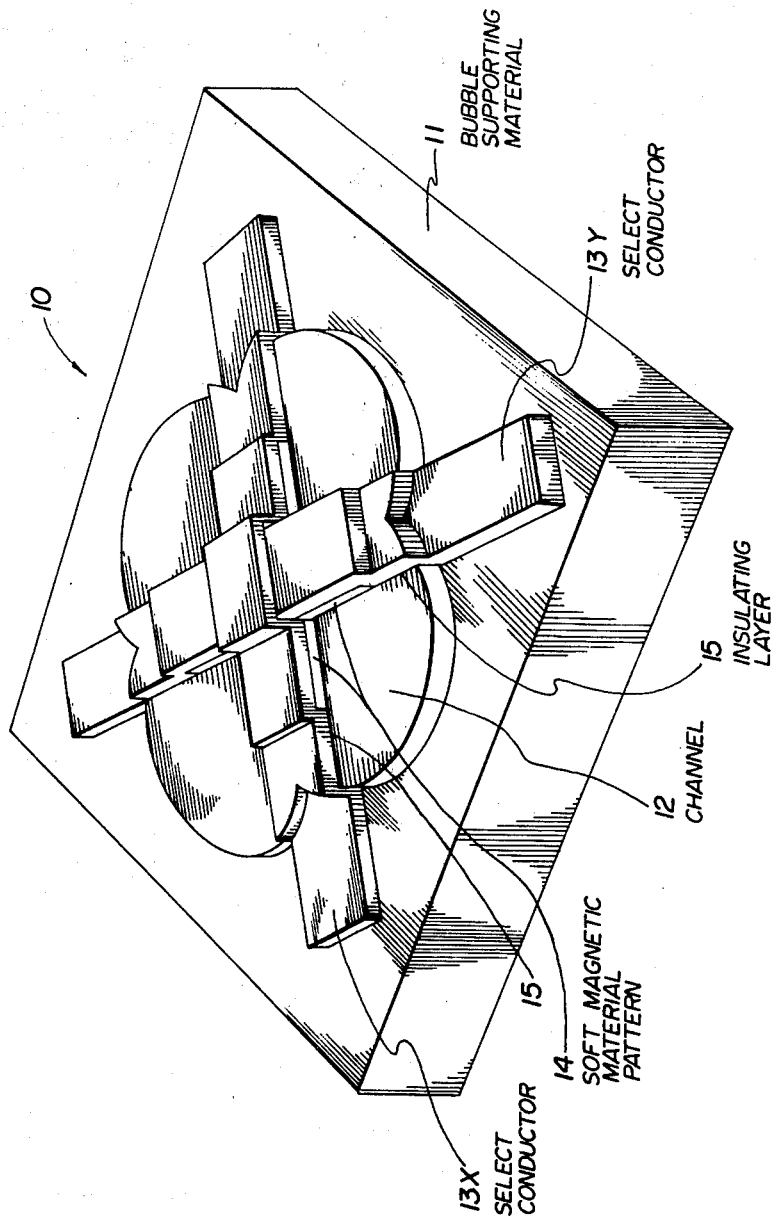
FIGS. 1 to 3 illustrate a four-state two select conductor cell.

Magnetic bubbles in a uniaxial magnetic materials can occupy different stable positions if a non-uniform magnetic field within the bubble material provides energy minima for the bubbles. Energy barriers between such minima can be temporarily altered in order to induce bubble motion from one stable position to another. If several stable positions are enclosed by a very high energy barrier, within the bubble material, then the bubbles can move only within that enclosed cell.

The energy barriers and traps may be obtained by various methods such as physical etching of the bubble material, surface ion implantation, diffusion of certain atoms, e.g. silicon, or deposition of thin film permalloy. The structure of the channels must be chosen so as to guarantee full stability of a bubble within a single cell or an array of cells. Specifically, a bubble must not collapse within a cell and must not switch between stable positions due to interactions, if any, from other bubbles either in other cells or within the cell. The switching of a bubble in accordance with this invention will occur under the influence of two coincident currents at or above predetermined level in the x and y directions. These currents may flow through one or more select conductor in each direction, such as one full current conductor, two half select conductors, etc. The switching process can be facilitated by soft magnetic material (SMM) appropriately shaped and situated at the crossing of the conductors. Current pulses are chosen to switch a bubble only within those cell compartments which are associated with the crossing of the selected conductors. A current pulse in only one direction cannot switch the bubble.

An array of such cells forms a multi-state random access memory which operates on a threshold basis, permitting coincident current access. Bubble-bubble interaction within a cell or between neighboring cells can be minimized by suitably locating the cells in an array. The bubble-bubble interaction within a cell or between cells can also be used to advantage, if so desired.

Since the interaction between stable bubbles in a uniform bubble material is negligible at a distance of approximately three bubble diameters, then the noninteractive cell array should have this separation between neighboring cells. The separation between cells might also be smaller due to the inherently higher stability of a bubble within a cell. The same applies to bubbles within a single cell.

The main feature of the cell in accordance with this invention lies in its ability to represent more than two states. This property qualifies the cell as a unique memory element for non-binary computers and other applications such as multiple-valued logic circuits. Another feature of the cell in accordance with this invention is that a four-state cell can be driven by a minimum of only two select conductors. In addition, one particular embodiment of the present cells can be utilized as a double bistable memory element, such that an array of these cells can be used in binary computers, reducing the number of select conductors and the driving circuits by 50% as compared with conventional (core-type) random access memories. Furthermore, the interaction between neighboring cells makes the cell amenable for parallel processors and in-memory function operators. The number of states can be modified by placing several bubbles within a cell.

Figure 2:
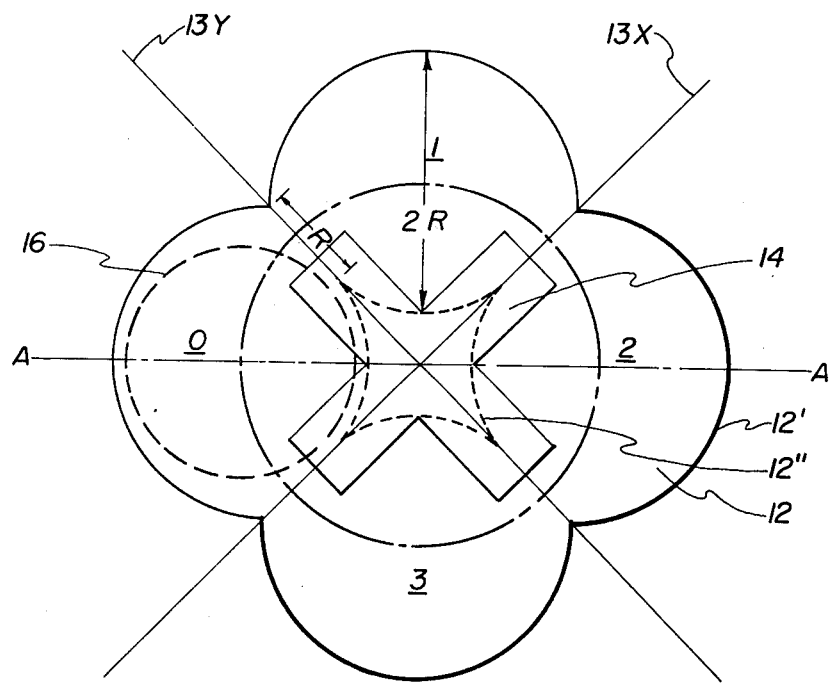
Figure 3:
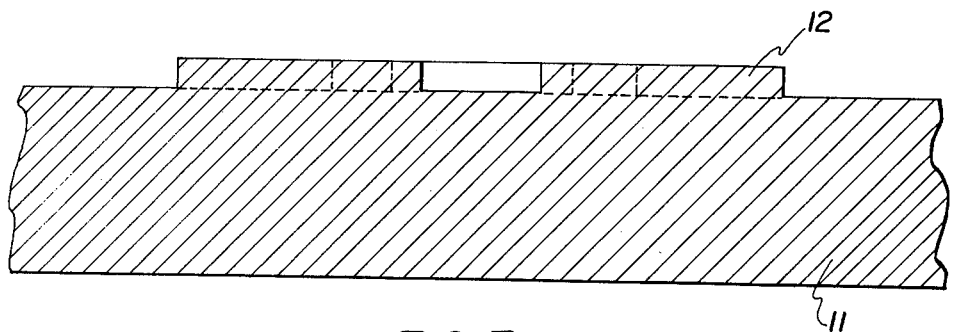

One form the multi-state cell in accordance with this invention may take is illustrated in FIGS. 1 to 3 wherein FIG. 1 is a perspective view of the cell 10, FIG. 2 is a schematic top view and FIG. 3 is a cross-section of the bubble material 11 taken along line A—A in FIG. 2.

The cell 10 which is formed on a bubble supporting material 11 consists of a channel pattern 12 which defines four-stable bubble positions 0, 1, 2 and 3, two select conductors 13x and 13y to switch the bubble between the stable positions, and a thin film soft magnetic material pattern 14 which may be included to facilitate the bubble switching from one stable position to another and to increase bubble stability when in a stable position. The conductors 13x and 13y may consist of conducting strips that are insulated one from the other and from the SMM pattern 14 and bubble material by an insulating layer 15.

The channel 12 as shown in FIGS. 1, 2 and 3 is etched in the bubble material 11 forming a width-modulated groove type or mesa-type closed-loop pattern having an outer contour 12 and an inner contour 12". The widest and the narrowest widths of the channel 12 could be, for example 2R and R respectively where R is the radius of a bubble 16 in the given bubble material. The effect of the channel 12 can be described by the magnetic field due to an electric current, flowing along the perimeter of the channel 12, equal in magnitude to the product of the depth of the channel and the difference in magnetization between the two sides of the channel wall. Channels with magnetization lower (grooves) and higher (mesas) than the magnetization of the surrounding medium are both stable; however, the groove-type channels have stable bubble positions at the edges of the channels while the mesa-type channels have stable bubble positions at their centers. Similar effects can be obtained if the channel is formed by other techniques.

Figure 4:
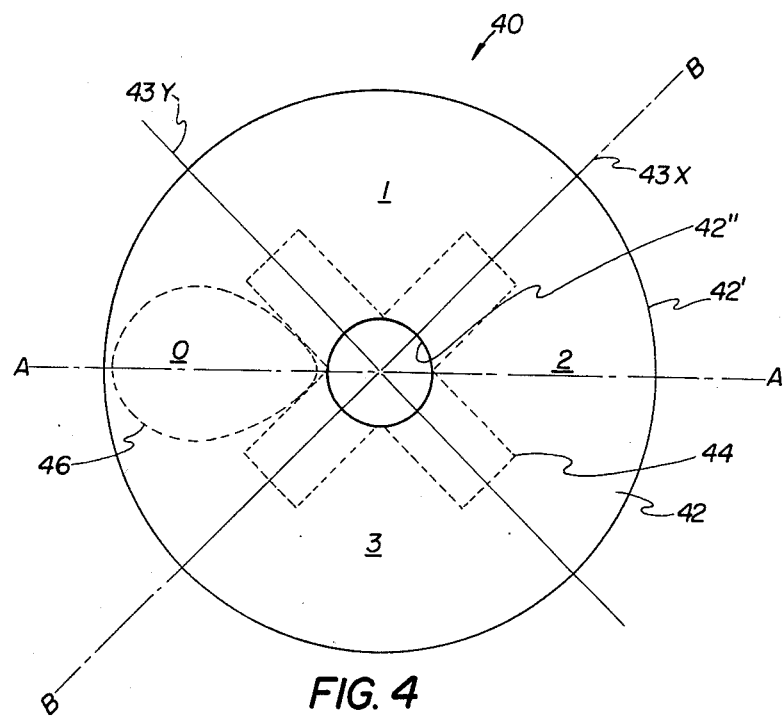
FIGS. 4 to 6 illustrate a four-state two select conductor cell with a depth modulated channel.
Figure 5:
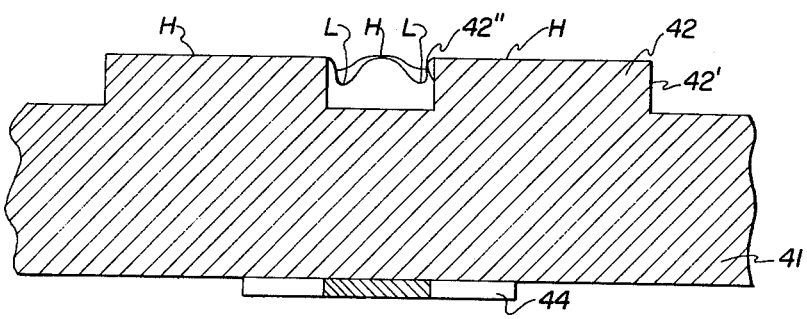
Figure 6:
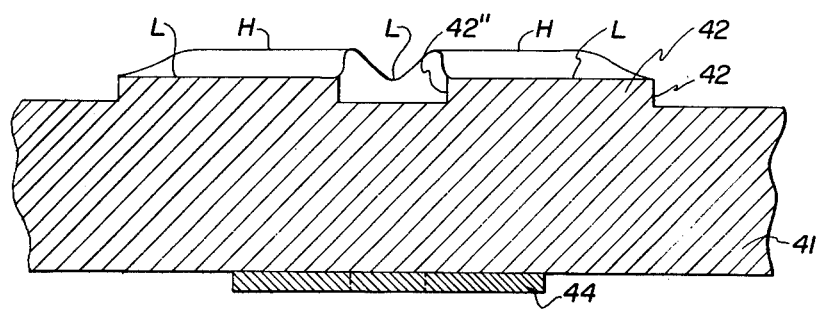

The channel shown in FIGS. 1, 2, and 3 is modulated only in width. Bubble traps can also be formed by varying the depth of the channel or both the width and the depth. FIGS. 4, 5 and 6 show another version of a four position cell where the groove-type or mesa-type channel is modulated in depth only. In cell 40, the channel 42 is etched in the bubble material 41 such as to have concentric outer 42' and inner 42" contours, forming a depth modulated channel having low mesas L and high mesas H. The channel 42 thus defines four stable bubble positions, 0, 1, 2, and 3. Two select conductors 43x and 43y, shown schematically in FIG. 4 are positioned in the low mesa to switch a bubble 46 from one stable state to another. A cross-section of the bubble material 41 and the channel 42 taken along A—A is shown in FIG. 5 while the cross-section taken along B—B is shown in FIG. 6. The thin film soft magnetic material pattern 44 arranged in the shape of an X is shown as being positioned beneath the bubble material 41 in this embodiment. The SMM 14 in FIG. 1 or 44 in FIG. 4 could be placed on either side of a bubble material 11(41) which is cut and polished from a bulk single crystal, such as orthoferrite, but for materials 11(41) grown on substrates, such as garnets, and for sputtered amorphous films, the SMM 14(44) must be on the same side as the circuit. The bars 14(44) must be separated from the bubble material 11(41) in order to prevent the bubbles from saturating the SMM 14(44). The thickness of the SMM could be in the range of 0.6 to 2 $\mu$m. The aspect ratio (width/length) of the bars 14(44) could be in the range of 3 to 7 and the width of the channel 12(42) could be somewhat less than R, the bubble radius. It is noted that the channels 12(42), the conductors 13x and 13y (43x and 43y) and the SMM patterns 14(44) in the figures are not drawn to scale.

Figure 7:
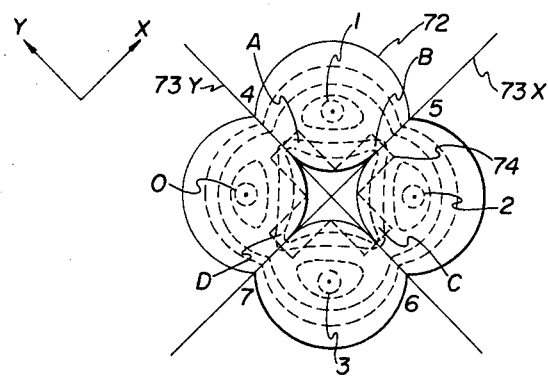
Figure 8:
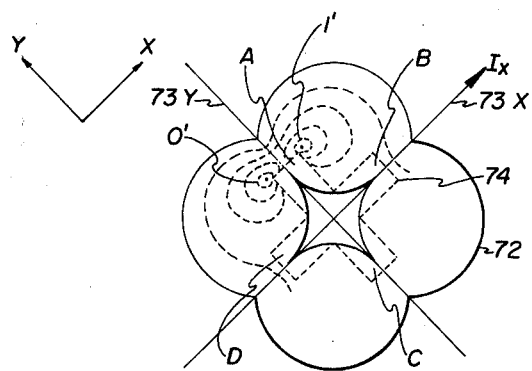
Figure 9:
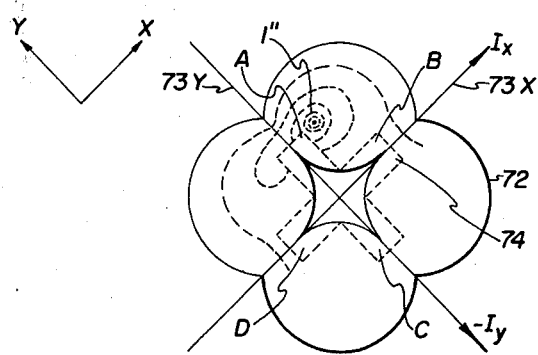

The principles of bubble switching in a cell in accordance with this invention are schematically illustrated in FIGS. 7 to 9 which, for simplicity, show the channel 72, the X-shaped soft magnetic material pattern 74 with its four poles A, B, C, and D and the conductors 73x and 73y.

FIG. 7 shows the vertical component of the effective field, averaged over the bubble material thickness due to the channel walls. There exist four traps 0, 1, 2, and 3 where a bubble can be stable and four barriers 4, 5, 6 and 7 where the bubble is unstable. The circuit is designed so that a bubble can move past a barrier if and only if currents are applied to both select conductors 73x, and 73y. FIGS. 8 and 9 illustrate the fields required to switch a bubble from 0 to 1. Assume a bubble is initially at the position 0. In FIG. 8, a current $+I_x$ is applied to conductor 73x so that the bar AC of pattern 74, is magnetized, both traps 0 and 1 shift toward the pole A and traps 2 and 3 shift away from C. The bubble will then move to 0' as shown in FIG. 8. The applications of $-I_y$ to 73y, as shown in FIG. 9 produces a magnetic field which reduces the energy of the 1' trap and increases the 0' trap; thus the bubble moves to 1". Note that $-I_y$ magnetizes the bar BD of pattern 74 to enhance the transition. When $+I_x$ and $-I_y$ are turned off then the bubble relaxes to the stable position 1 shown in FIG. 7. It is noted that the presence of a bubble within the channel changes the field distributions shown in FIGS. 7 to 9. It is also noted that in this cell 70, as well as the cells to be described, one current leading edge occurs first for heuristic reasons. The cell will achieve the same final state if the currents leading edges occur in reverse order or simultaneously.

A switching sequence is shown in FIGS. 10 to 15 wherein the channel 102, the conductors 103x and 103y, the SMM X-pattern 103 with poles A, B, C, and D and a bubble 106 are shown. FIGS. 10 to 15 further represent the position of the bubble 106 at time $t_o$, $t_1$, $t_2$, $t_3$, $t_4$, $t_5$ and $t_6$ respectively. FIG. 16 illustrates the sequence of currents pulses in conductors 103x and 103y for switching the bubble 106 from positions 0 to 1, to 2, to 3, and back to 0. In FIG. 10, at time $t_o$, the bubble 106 is stable at position 0. In FIG. 11, a pulse $+I_x$ at time $t_1$, magnetizes the bar AC in such a way that the pole A attracts the bubble 106. In FIG. 12, a pulse $-I_y$ at time $t_2$ magnetizes the bar BD to produce a field gradient which permits the bubble 106 to move across the barrier between positions 0 and 1. In FIG. 13, both currents $+I_x$ and $-I_y$ are turned off at time $t_3$ which allows the bubble 106 to relax at the stable position 1. In FIG. 14, a pulse $-I_y$ at time $t_4$ magnetizes the bar BD such that pole B attracts the bubble 106. In FIG. 15, a pulse $-I_x$ at time $t_5$ magnetizes the bar AC to produce a field gradient which permits the bubble 106 to move across the barrier between positions 1 and 2. When both currents $-I_y$ and $-I_x$, at time $t_6$, are turned off, the bubble 106 relaxes to positions 2. The bubble 106 can be similarly switched to position 3 and then back to position 0 by the application to conductors 103x and 103y of the current pulses shown in FIG. 16. The bubble 106 can also be switched in the reverse sequence or between any two adjacent stages by the application of the appropriate select current pulses.

It is essential that the magnitudes of the select currents are chosen so that neither of them alone can cause the bubble to switch. The exact synchronization of the leading and/or trailing edges of the pulses $I_x$, $I_y$ is unnecessary. Also, the X-shaped SMM does not have to be symmetrical and its arms do have to be parallel to the select lines. Furthermore, the shape of the cell can take various forms as long as the stable positions for the bubbles are well defined and separated by appropriate energy barriers. Further examples of cells satisfying these conditions are shown in FIG. 17 which illustrates a four state cell 170 and in FIG. 18 which illustrates a three state cell 180.

Figure 17:
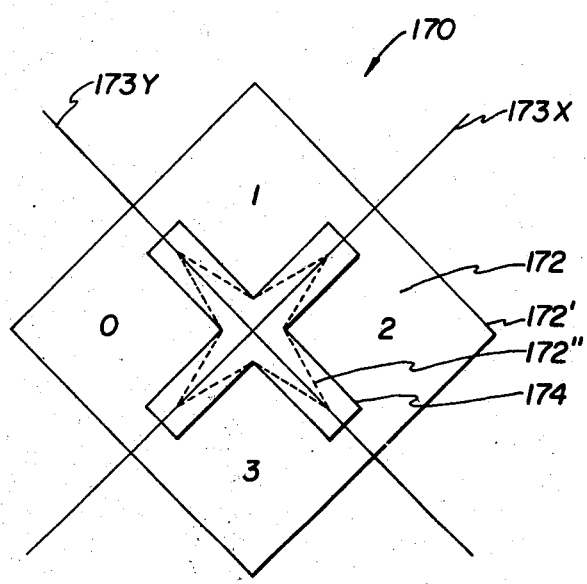
FIG. 17 illustrates a third embodiment of a four-state cell.

Cell 170 in FIG. 17 includes a channel 172 having an outer square contour 172' and an inner star shaped contour 172" to form four stable position 0, 1, 2, and 3 separated by barriers. A soft magnetic material X pattern 174 is positioned over the inner contour 172" of channel 172 upon which the select conductors 173x and 173y are placed.

Figure 18:
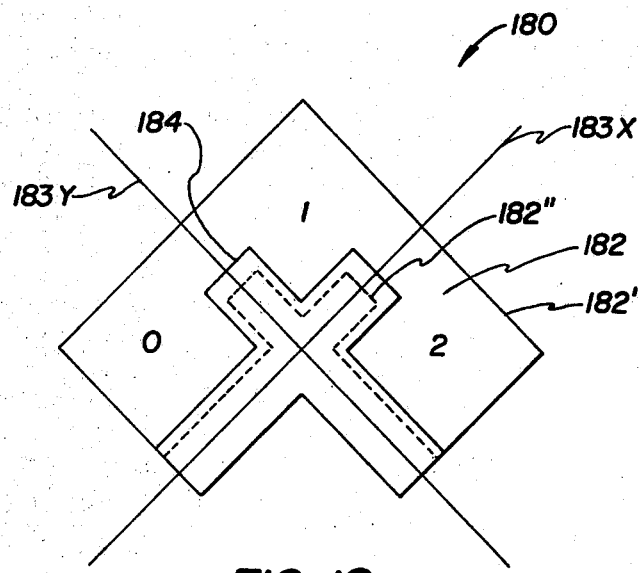
FIG. 18 illustrates a three-state cell.

Cell 180 in FIG. 18 is similar to cell 170 except that position 3 is eliminated, and the soft magnetic material pattern 184 extends to the outer contour 182" of the channel 182.

Cells 170 and 180 are operated in a manner as described with respect to FIGS. 10 to 16, however in cell 180, a bubble will not move from position 2 to position 0, but can be reversed in the channel 182.

Figure 19:
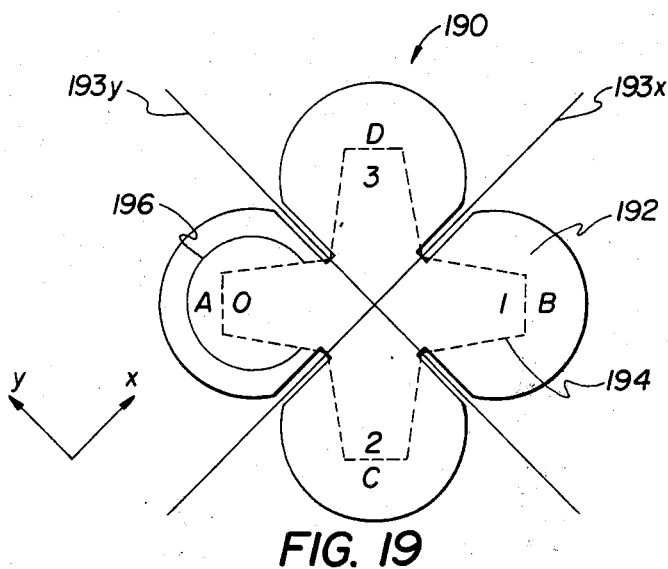
FIGS. 19 to 21 illustrate second type of four-state cell which also may be utilized as a two-bistable cell.
Figure 21:
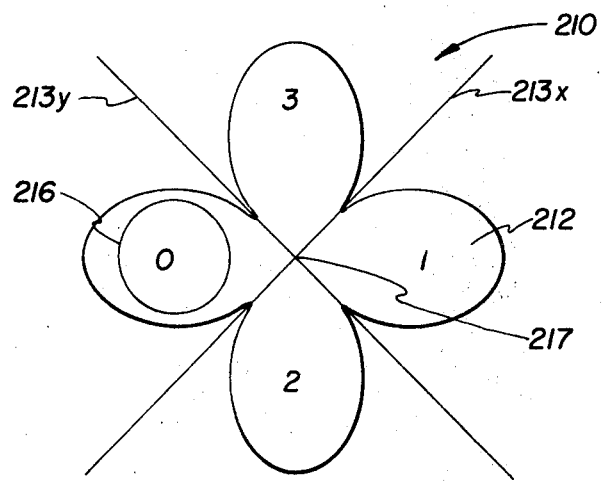

Other embodiments of a four-state cell with two select conductors are shown in FIGS. 19 and 21. The cell 190 in FIG. 19 has a cloverleaf shaped channel 192 with spacings between the leaves producing the barriers between the stable positions 0, 1, 2, and 3. In addition the center of the pattern 192 is not open.

Figure 20:
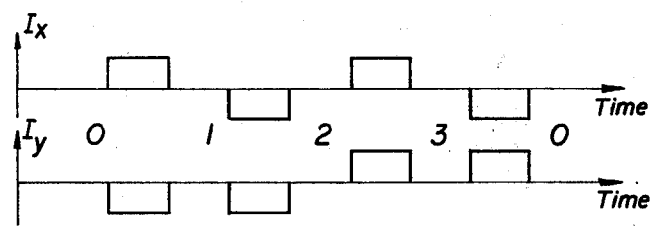

The X-shaped SMM pattern 194 in this cell however is positioned such that ends A, B, C and D of the pattern overlay the stable positions 0, 1, 2 and 3 respectively. The select conductors 193x and 193y are positioned over the barriers. The bubble switching process is different from that described in conjunction with FIGS. 7 to 16, in that a bubble when switched between two states must slide under the SMM pattern 194 when appropriate currents are applied to the select conductors 193x and 193y. Switching currents for cell 190 are shown in FIG. 20.

A bubble 196 is switched from the position 0 to 1 by the application of $+I_x$ and $-I_y$. These currents magnetize the bar AB so that the pole A repels the bubble and the pole B attracts it. The bar CD is essentially inactive. The switching from 1 to 2 is caused by the application of $-I_x$ and $-I_y$ which magnetizes bar CD such that pole C attracts the bubble and bar AB is essentially inactive. In cell 190, a bubble can be switched to any stable position regardless of its previous location. If $-I_x$ and $+I_y$ currents are applied, the bubble will move to the 0 position; if $+I_x$ $-I_y$ currents are applied, the bubble will move to the 1 position; if $-I_x$, $-I_y$ currents are applied, the bubble will move to the 2 position, and if $+I_x$, $+I_y$ currents are applied, the bubble will move to the 3 position. This characteristic provides for greater flexibility in operation.

Cell 210 in FIG. 21 is similar to cell 190 in FIG. 19 in that it has a cloverleaf shaped channel 212 forming four stable positions 0, 1, 2, and 3 and two select conductors 213x and 213y positioned over the barriers. Cell 210 does not however have a SMM pattern. The currents required for bubble switching are similar as those described in conjunction with FIG. 20, and the operation of this cell is possible because the transition of a bubble 216 between the states must occur under the conductor crossing 217 where the field gradients are greatest.

Figure 22:
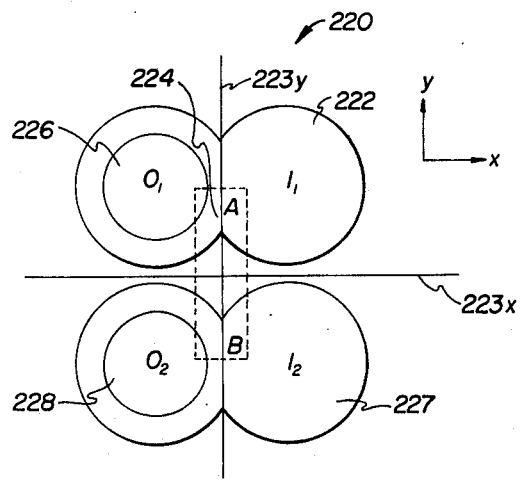
FIGS. 22 to 24 illustrate a third type of four-state cell.

A further embodiment of a four-state cell is illustrated in FIG. 22. The cell 220 consists of two separate channels 222 and 227 positioned in parallel and each shaped in a FIG. 8 pattern to produce two stable positions 0 and 1 with a barrier between these positions. The positions are shown in FIG. 22 as $O_1$ and $l_1$ for channel 222 and $O_2$ and $l_2$ for channel 227. A soft magnetic material bar 224 with poles A and B positioned to overlap the barriers in channels 222 and 227 respectively. A select conductor 223x is positioned longitudinally between the two channels 222 and 227 and a select conductor 223y is positioned perpendicular to conductor 223x over bar 224.

Magnetic bubble domains 226 and 228 are placed in channels 222 and 227 respectively and are shown as being in the 0 positions.

Figure 23:
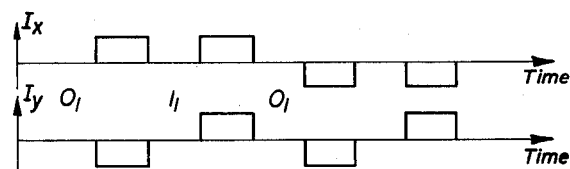

In operation, the movement of bubbles 226 and 228 are individually controlled as shown in FIG. 23. Bubble 226 can only be moved when $I_x$ is positive since pole A attracts bubble 226 and pole B repels bubble 228, and bubble 228 can only be moved when $I_x$ is negative since in this case pole B attracts bubble 228 and pole A repels bubble 226. To complete the transfer of the bubbles across the barrier, a negative pulse on $I_y$ will drive a bubble to the 1 position while a positive pulse on $I_y$ will drive a bubble to the zero position.

Figure 24:
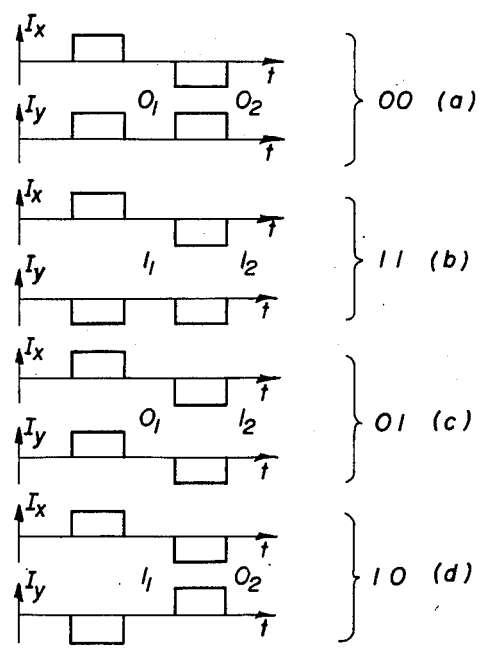

As shown on FIG. 24, four possible bubble position combinations 00, 01, 11 and 10 can be achieved in any sequence by simultaneously applying a series of two appropriate current pulses on the two select conductors 223x and 223y. An important feature of the cell in FIG. 22 lies in its ability to operate two separate bistable state which only two select conductors and therefore it can be used as a memory element in a binary computer. The number of select conductors and driving circuits for such a memory would be 50% lower as compared to the ordinary core-type memories, with the same storage capacity.

The cells described with respect to FIGS. 1, 4, 17, 19, 21 and 22 are all two select conductor four state cells, these basic cells however may be expanded into large multi-state multi-conductor cells. Some possible embodiments of multi-state cells are illustrated in FIGS. 25 to 28.

Figure 25:
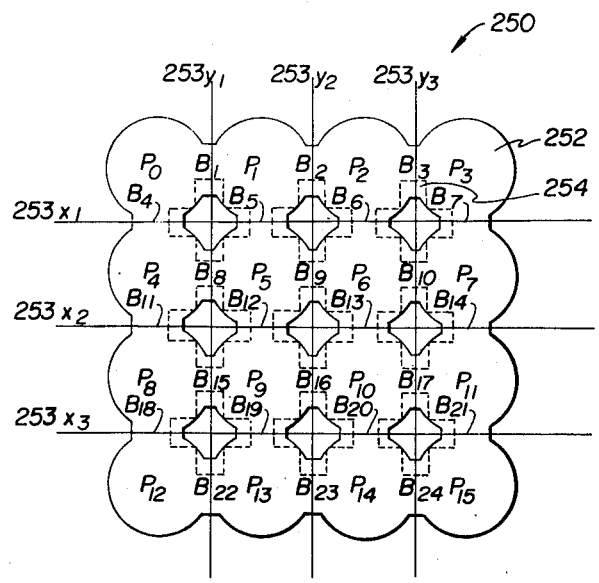
FIGS. 25 to 26 illustrate a multi-state six conductor cells.

FIG. 25 illustrates a six conductor cell 250 derived from the type of cell described with respect to FIGS. 1, 4, or 17. Through a symmetrical six-conductor cell is described, other symmetrical $m$-conductor cells may be constructed which have $m/2$ $x$-conductors and $m/2$ $y$-conductors or again other asymmetrical $m$-conductor cells may be constructed which have $n$ $x$-conductors and $p$ $y$-conductors where $n + p = m$ and $n \neq p$.

The six conductor cell in FIG. 25 consists of a matrix 252 of stable bubble positions $P_0, P_1, P_2 \ldots P_{15}$ separated by barriers $B_1, B_2, B_3 \ldots B_{21}$. Soft magnetic material X-patterns 254 are formed at each of the points between four adjacent stable positions such that their poles extend along the barriers between these four positions, three conductors $253x_1$, $253y_2$, and $253x_3$ overlay the series of patterns in the $x$ direction and a further three conductors $253y_1$, $253y_2$ and $253y_3$ overlay the series of patterns in the $y$ direction to form a $3 \times 3$ matrix of select conductors.

Cell 250, which is basically constructed in the same manner as the above four state cells, operated in the same manner as described with respect to FIGS. 7 16 in that an appropriate current pulse on one $x$-conductor and on one $y$-conductor is required to transfer a bubble from one position to an adjacent position.

This cell has 16 stable bubble positions. If only a single bubble is used, then 16 states are possible with this cell. In general, the total number of positions or single-bubble states $c$ of a symmetrical multi-state multi-conductor cell could be $$c = \left(\frac{m}{2} + 1\right)^2, m > 2$$

where $m$ is the number of select conductors per cell. The number of states $s$ in this cell for $N$ non-interacting bubbles is $$S = \frac{c!}{N!(c-n)!}$$

in order to maximize $s$ it is necessary that
$N_{opt} = c/2$.

For example, a six-select-wire cell has $c = 16$, $N_{opt} = 8$ and $S = 12,820$. However, for the same number of select conductors the four-state cell of FIG. 22 could store 18 bits of information corresponding to $s = 2^{18} = 262,114$. Thus, if information storage is the only criterion than it is more efficient to use an array of four-state cells.

Figure 26:
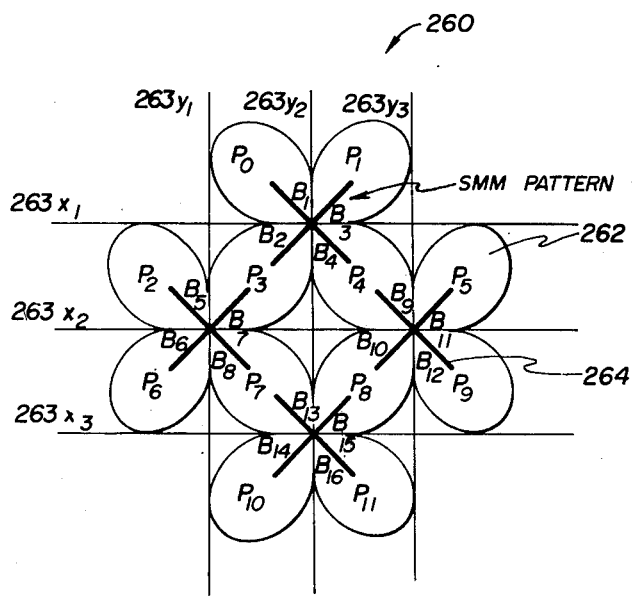

The six-wire cell 260 illustrated in FIG. 26 is based on the four-state cells described with respect to FIGS. 19 or 21 in that the magnetic bubble domain moves under the SMM pattern or the junction of an $x$ and $y$ conductor. Cell 260 includes four cell patterns of the type described with respect to FIG. 19, with two bubble stable positions in each being common with adjacent cells. Cell 260 consists of a pattern 262 of bubble positions $P_0, P_1, P_2, P_3 \ldots P_{11}$ separated by barriers $B_1, B_2, B_3 \ldots B_{16}$, appropriately positioned soft magnetic material X-patterns 264 having individual poles extending over the stable positions, and 6 conductors $263x_1$, $263x_2$, $263x_3$, $263y_1$, $263y_2$ and $263y_3$, the $x$-conductors overlaying the barriers in the $x$ direction, and the $y$-conductors overlaying the barriers in the $y$ direction. For a single bubble, cell 260 has a fewer number of stable positions, 12 instead of 16, than cell 250 in FIG. 25, but it has the advantage of the greater versatility described with respect to FIG. 19.

Figure 27:
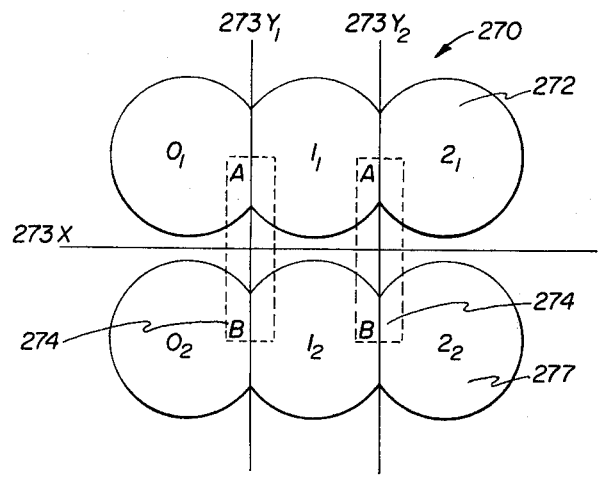
FIGS. 27 and 28 illustrate six-state three conductor cells.
Figure 28:
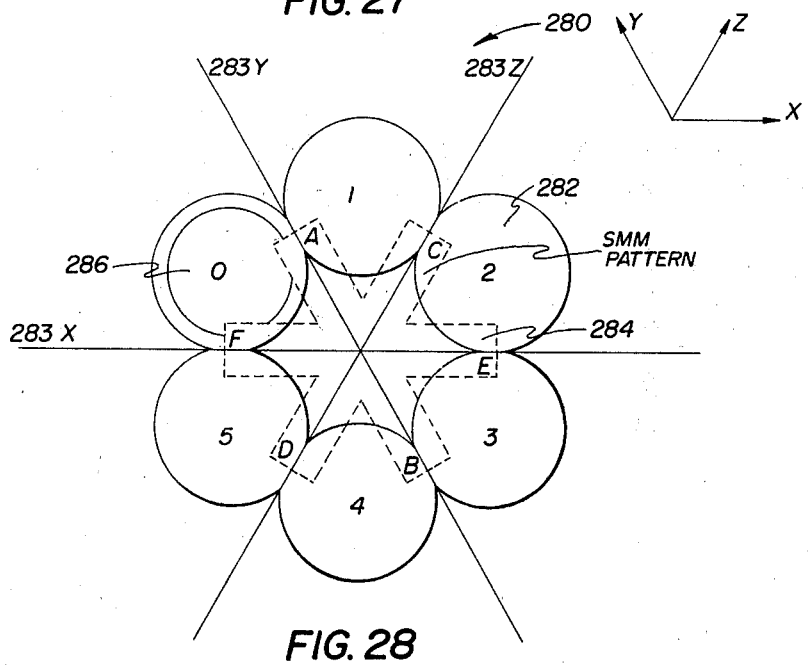

Further embodiments of multi-state cells are shown in FIGS. 27 and 28 which illustrate two forms of 6-state, three select conductor cells. In FIG. 27, cell 270 is similar to cell 220 in FIG. 22, in that it includes two separate channels 272 and 277 positioned in parallel. Each channel 272 and 277 however includes a series of bubble positions $0_1, 1_1, 2_1$, and $0_2, 1_2, 2_2$, respectively separated by barriers. Each channel may be extended to include any number of stable positions. Soft magnetic material bars 274 with poles A and B are positioned to overlay adjacent barriers in channels 272 and 277 respectively. A select conductor $273x$ is positioned longitudinally between the two channels 272 and 277 and select conductors $273y_1$ and $273y_2$, are positioned perpendicular to conductor $273x$ over each of the bars 274. A magnetic bubble domain is placed in each of the channels, the transfer operation of the bubbles in each channel is similar to that of cell 220 as described with respect to FIG. 23.

The second embodiment of a 6-state 3-conductor cell 280 illustrated in FIG. 28 is based upon the four-state cell 10 described with respect to FIG. 1. Cell 280 includes a channel 282 having six stable positions 0, 1, 2, 3, 4, 5, spaced equidistant along the circumference of a circle. The soft magnetic material pattern 284 has three set of opposite poles A–B, C–D, and E–F spaced 120° to each other such that each pole overlays a barrier between two adjacent stable positions. Finally three conductors $283x$, $283y$, and $293z$ are positioned to overlay the SMM 284 and the barriers. In operation, a pair of SMM bars are magnetized by a current in a single select conductor, for example, $I_x$ magnetizes bars A–B and C–D, nevertheless, as in cell 10 in FIG. 1, appropriate pulses on only two select conductors are required to switch a bubble between two states. For example, two current Ix and Iy would switch a bubble 286 between the 0 stable position and the 1 stable position.

In order to use any of the above described cells as RAM elements, suitable cell-state readout is required. Readout method is based upon the property that each state of the cell is represented by a unique geometric configuration of bubbles within the cell. Thus each configuration could be recognized by the use of sensors distributed either (i) at each compartment of the cell or (ii) at unique locations within the cell. A sensor is understood here as a device capable of detecting either the presence or the absence of a bubble. There are two types of sensors, absolute and differential. Absolute sensors can detect the presence of a static bubble while differential sensors require bubble motion. Such sensors could be classified as optical based on either the Kerr or the Faraday effects, inductive, galvanomagnetic, magnetoresistive, magnetostrictive-piezoelectric, or acoustic. All of the sensors can be used as differential sensors but the optical and acoustic could also be used as absolute sensors. If dependable absolute sensors were currently available, the readout of RAM cells in accordance with this invention would be relatively simple, but, since currently available sensors are of the differential type, only the implementation of cells with the differential sensors will be described.

Figure 29:
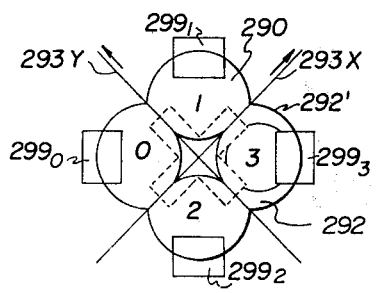
FIGS. 29 to 30 illustrate two cell embodiment with destructive read out.

In a first configuration of sensors, the bubble presence or absence could be detected by an attempt to move the bubble out from the sensitivity region of a sensor; thus producing either a change or no change in the output signal from the sensing system. The sensor system shown in FIG. 29 is utilized for a cell of the type shown in FIG. 1. A sensor $299_0$, $299_1$, $299_2$, $299_3$ is placed at the edge of each stable bubble position 0, 1, 2, 3, respectively of the channel 292 on the outer contour 292'. To detect the location of bubble in one of the stable positions, a pair of pulses $+I_x$ and $+I_y$ are applied to conductors 293x and 293y respectively, and the sensors at positions 1 and 3 will detect any transfer of a bubble out of these positions into stable position 0. A second pair of pulses $+I_x$ and $-I_y$ are then applied to conductors 293x and 293y respectively and the sensors at positions 0 and 2 will detect any transfer of a bubble out of these positions into stable position 1. Therefore only one sensor will provide an output signal.

Figure 30:
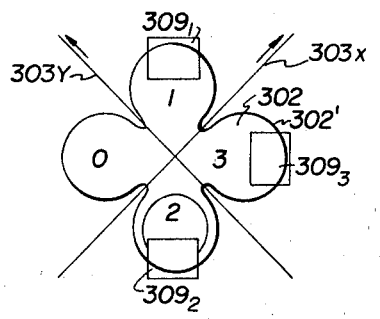

The sensor system shown in FIG. 30 is utilized with a cell of the type described with respect to FIGS. 20 or 21. Only three sensors $309_3$, $309_1$, $309_2$ are required, one at each of the positions 3, 1, and 2 on the outer contour 302' of channel 302.

To detect the location of a bubble a pair of pulses $+I_x$ and $+I_y$ are applied to the conductor 303x and conductor 303y respectively switching a bubble from any one of these positions to the 0 position, the movement of the bubble from one of the positions 3, 1 or 2 will be detected by the sensor at the respective position. If a signal is not forthcoming from either of the three sensors, it is assumed that the bubble was originally in the 0 position.

The above readout method for RAM cells is effective, however it is noted that it is destructive i.e. the bubble assumes a position after readout which differs from its position before readout.

In a second configuration of sensors, a change or no change in the output signal can be observed by trying to move a bubble temporarily into a specific read location, this method will be described with respect to FIGS. 31 to 38 provides a non-destructive readout. Two types of cell structures are described, the first with respect to FIGS. 31 to 34 in which a bubble, if any is forced into a specific read location and then due to a difference in geometry of the read location and the state location, the bubble returns to the state location, and the second with respect to FIGS. 35 and 36 in which a bubble, if any is forced into and from a specific read location.

Figure 31:
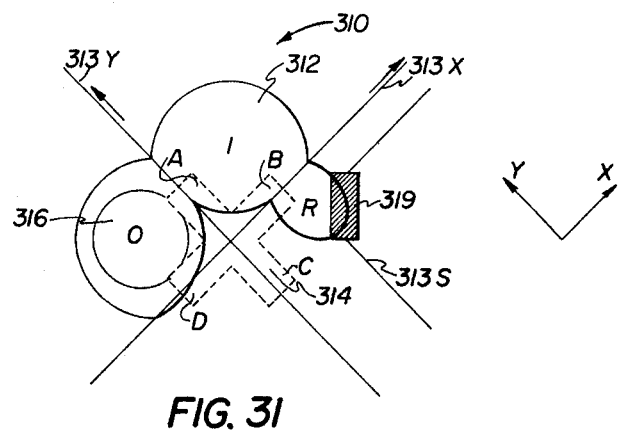
FIGS. 31 to 36 illustrate four cell embodiments with non-destructive readout.
Figure 32:
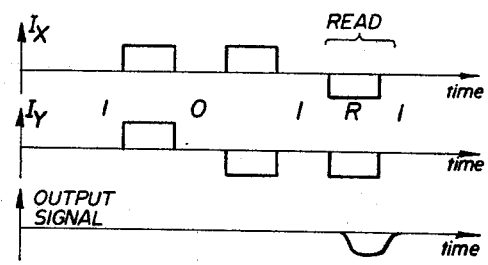

The two-select-wire cell 310 shown in FIG. 31 is a simplified version of a cell structure 10 of FIG. 1, and it could be used in binary random access memories. Cell 310 has a channel 312 with two stable positions 0 and 1 and one unstable position R. The read position R is unstable due to its shape and size. As in FIG. 1, the cell 310 includes a soft magnetic material X-pattern 314 with poles A-C and B-D, and select conductor 313x and 313y. The cell 310 further includes a sensor 319 over the unstable position R and a sensing line 313 R. As previously described with respect to FIGS. 7 to 16 a bubble 316 can be switched from 0 to 1 by the application of $+I_x$ and $-I_y$ pulses to conductors 313x and 313y, and from 1 to 0 by the application of $+Ix$ and $+Iy$ pulses to the conductors. To read the cell 310 state, pulses $-Ix$ and $-Iy$ shown in FIG. 32, are applied to the select conductors 313x and 313y respectively. The current $-I_y$ induces an attractive pole B and the current $-I_x$ produces a sufficient field gradient to move a bubble from 1 to R. An output signal occurs in the sense line 313 only when the bubble is brought to the vicinity of the sensor 319 and not when the bubble is in the position 0 or 1. When the select currents are turned off then the bubble returns from R to 1 because the asymmetry of the channel between the two positions 1 and R produces a built-in field gradient. It may appear that, to overcome this gradient, the read currents are greater than the switching currents and yet not affecting the stable bubble position at 0. It is noted that the read currents cannot produce the switching if a bubble occupies the position 0; thus the output signal is zero. Also half select currents, applied to only one line at a time, cannot affect the states of the cell 310. It is also noted that this method of cell reading offers a full modulation range of the output signal on a single sense line 313S within a memory matrix because one and only one bubble is moved under the sensor at a time.

Figure 33:
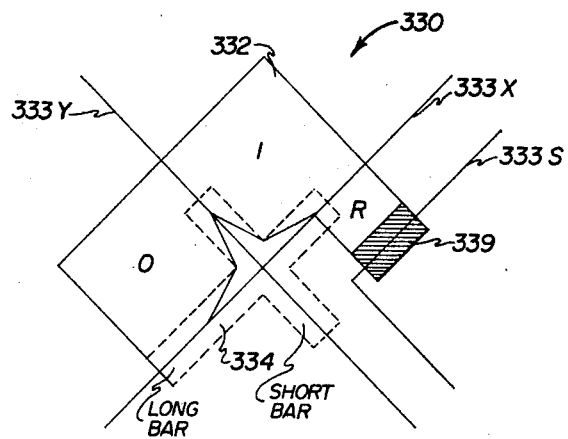

Many variations of cell structures for non-destructive readout operation are possible within the scope of this invention. A further example based on the cell structure described with respect to FIG. 18 is illustrated in FIG. 33. The cell 330 includes a channel 332 have two stable positions 0 and 1 and a read position R, with an SMM X-pattern 334 with bars of unequal length and select conductors 333x and 333y. A sensor 339 with its sense line 333S is located over the unstable position R. Due to the shape of the pattern 334, the bar with a higher aspect ratio has a lower demagnetizing field and hence it can be brought to saturation with a lower magnetizing current. In other words, the dimensions of the bars could be chosen so that the switching and the read currents might be of equal magnitude, if desired.

Figure 34:
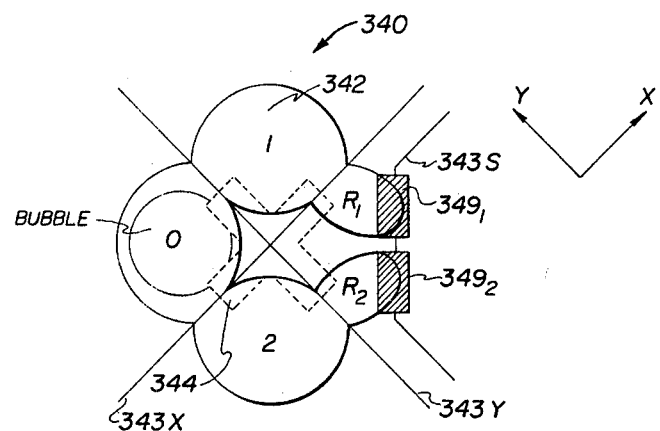

Another example, based on the cell structure described in FIG. 1, is the three state cell 340 illustrated in FIG. 34. Cell 340 includes a channel 342 having three stable positions 0, 1 and 2 and two unstable position $R_1$ $R_2$ which replace the fourth stable position of the cell in FIG. 1. It further includes a similar soft magentic material X-pattern 344 and select conductors 343x and 343y. A sensor $349_1$ is positioned over the unstable position $R_1$ and further sensor $349_2$ is positioned over unstable position $R_2$. In order to detect the location of a bubble 346, pulses $-I_x$ and $-I_y$ are simultaneously applied to conductors 343x and 343y. If the bubble 346 is originally located in position 1, it will move temporarily to position $R_1$ and sensor $349_1$ will detect it, if the bubble 346 is originally located in position 2, it will move temporarily to position $R_2$ and sensor $349_2$ will detect it, and if the bubble 346 is originally located in position 0, it will not switch position and will not be detected by either sensor. If it is desired to have both sensors $349_1$ and $349_2$ on a single sense line 343S as shown on FIG. 34, one of the sensors will be required to produce an output signal of an amplitude larger than the signal from the other, or the sensors may produce signals of opposite polarity. On the other hand, each sensor may have its own sense line.

Figure 35:
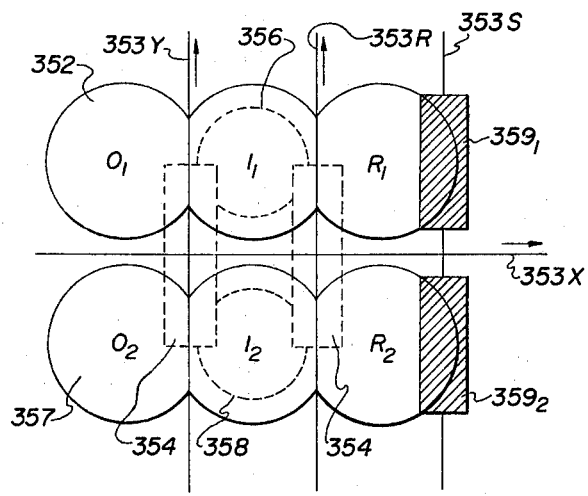
Figure 36:
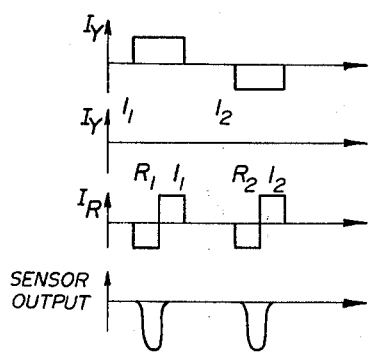

The cell 350 in FIG. 35 is similar to cell 270 in FIG. 27 in that it includes two channels 352 and 357, each having a series of three stable position 0, 1 and R, a pair of soft magnetic material bars 354 and three select conductors 353x, 353y, and 353R. However, cell 350 further includes sensors $359_1$ and $359_2$ over positions $R_1$ and $R_2$ connected by a sense line 353S such that positions $R_1$ and $R_2$ are bubble read positions for a cell of the type described in FIG. 22, and conductor 353R is a readout control conductor. Bubble 356 is switched between the $0_1$ and the $1_1$ positions and bubble 358 is switched between the $0_2$ and $1_2$ positions as described with respect to FIG. 23. The position $1_1$ is read by the simultaneously applying of a $+I_x$ pulse on conductor 353x and a current $I_R$ pulse on conductor 353R. As shown in FIG. 36, $I_R$ is first negative which switches a bubble 356 that is in position $1_1$ into position $R_1$, this transfer is detected by sensor $359_1$. The current $I_R$ is then positive which switches the bubble back to $1_1$. The position $1_2$ is read by simultaneously applying an $-I_x$ pulse on conductor 353x and a current $I_R$ on conductor 353R. $I_R$ is once again first negative to switch a bubble 358 in position $1_2$ into position $R_2$ and then positive which switches the bubble back to $1_2$.

The purpose of the third conductor 353R is, therefore, to bring a bubble if it occupies positions $1_1$ or $1_2$ in the vicinity of either sensor and then return the bubble to its original position. The sensors could be idendical because the states are read one at a time. If the bubbles occupy positions $0_1$ and $0_2$, the output signal is zero. The readout operation is non-destructive because the return of a bubble from $R_1$ and $R_2$ is unconditional, and it is a part of the readout process. This cell has three conductors but, since the cell can be regarded as two independent bit locations within a binary RAM the number of conductors is still less than that required by conventional core-type RAM's.

Figure 37:
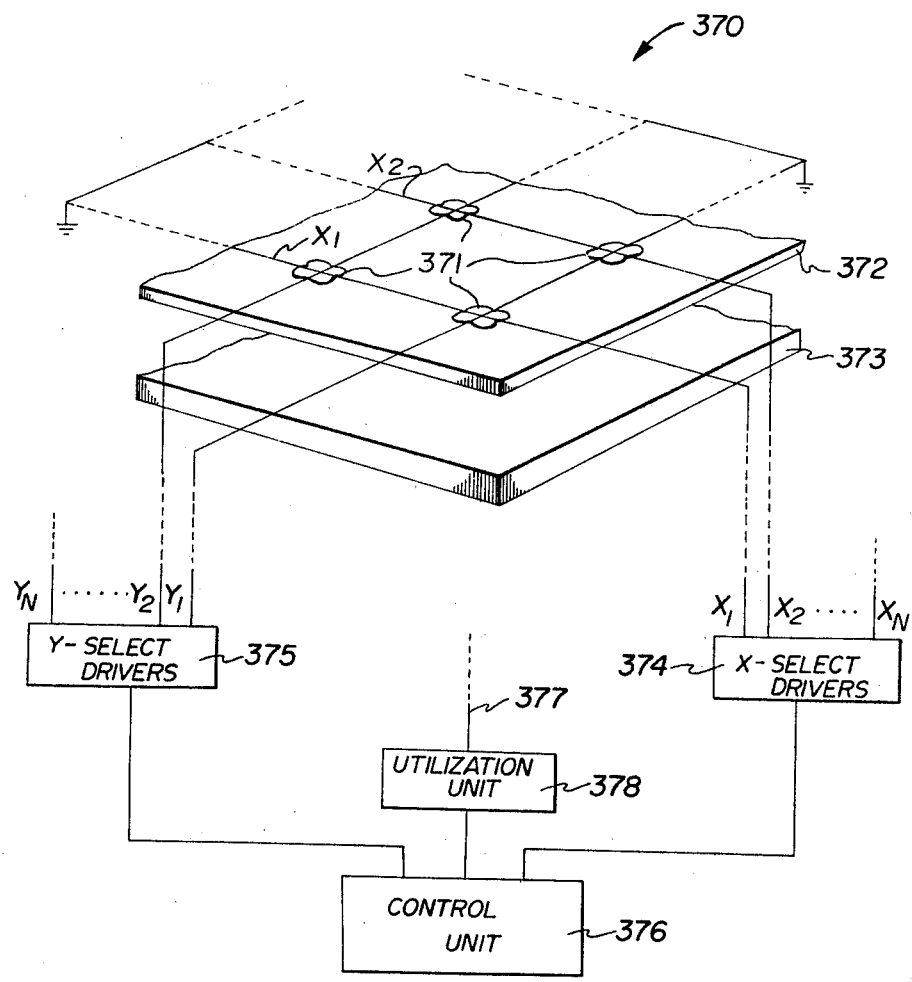
FIG. 37 illustrates a schematic of a random access memory.

Any of the above described cells may be used in a random access memory which is accessed by coincident currents. One such systems 370 is illustrated in FIG. 37 wherein an array of four state cells 371 are formed in a bubble material 372 which overlays a bubble domain biasing device 373. The conductors $x_1, x_2 \ldots$ and $y_1, Y_2 \ldots$ for the cells are driven by an x-select driver 374 and y-select 375 respectively under the control of a control unit 376. The sense lines 377 from the cells 371 are coupled to a utilization device 378. Utilization device 378 is also coupled to control unit 376 which controls the readout operation of cells 371 as well as the read in operation.

We claim:

1. A multi-state bubble memory cell comprising: channel means formed in a magnetic bubble supporting material said channel means having a number of discrete energy minima positions separated by barriers to provide stable magnetic bubble positions; and switching means for each pair of adjacent stable positions having first select current conductor means positioned over the barrier between the two stable positions and second select current conductor means positioned adjacent to the two stable positions, for conducting predetermined coincident currents to produce a magnetic field in the cell for switching a magnetic bubble across the barrier from the one stable position to the other stable position.

2. A multi-state bubble memory cell as claimed in claim 1 which further includes means for sensing the presence of bubbles at the stable positions within the cell to determine the state of said cell.

3. A mult-state bubble memory cell as claimed in claim 1, wherein said channel has two stable bubble positions and further includes an unstable bubble position adjacent one of said stable bubble positions and sensing means located at said unstable bubble position to detect the movement of a magnetic bubble into said unstable bubble position.

4. A multi-state bubble memory cell as claimed in claim 1, wherein said channel has three successive stable bubble positions and further includes an unstable bubble position adjacent the first and the third stable bubble positions, and sensing means located at each of said unstable bubble positions to detect the movement of a magnetic bubble into the unstable bubble position.

5. A multi-state bubble memory cell as claimed in claim 1, which further includes a thin film soft magnetic material pattern positioned on said bubble supporting material to be magnetized by currents in the conductor means to enhance switching of a bubble from one position to another position.

6. A multi-state bubble memory cell as claimed in claim 5, wherein said thin film pattern consists of bars having poles located over the barriers between adjacent stable positions.

7. A multi-state bubble memory cell as claimed in claim 5, wherein said thin film pattern consists of bars having poles located over the stable bubble positions.

8. A multi-state bubble memory cell comprising channels means formed in a magnetic bubble supporting material, said channel means having a number 2m of discrete energy minima positions separated by barriers to provide 2m stable magnetic bubble positions, said stable bubble positions being symmetrically located along a circular path; and switching means having m select current conductor means, each of said conductor means positioned on a different axis diametrically across said channel means over two barriers between two pairs of adjacent stable positions, wherein a magnetic bubble is switched across a barrier between two adjacent stable positions when predetermined coincident currents are driven through two of the select current conductor means.

9. A multi-state bubble memory cell as claimed in claim 8 which further includes bubble sensing means for detecting the presence of a bubble at the stable positions within the cell to determine the state of said cell.

10. A multi-state bubble memory cell as claimed in claim 8 which further includes m thin film soft magnetic material bars forming a pattern on said bubble supporting material to be magnetized by the coincident currents to enhance switching of a bubble from one position to an adjacent position, each of said bars being located on a different one of said axis.

11. A multi-state bubble memory cell as claimed in claim 8 which further includes m thin film soft magnetic bars forming a pattern on said bubble supporting material to be magnetized by the coincident currents to enhance switching of a bubble from one position to another position, each of said bars extending across a different pair of diametrically opposite stable positions and having one pole located over each stable position.

12. A multi-state bubble memory cell comprising: first and second parallel channel means formed in magnetic bubble supporting material, each of said channel means having a number m of successive discrete energy minima positions separated by barriers to provide m stable magnetic bubble positions; and switching means having $(m-b)$ first select current conductor means, each of said conductor means successively positioned across the first and second channel means over a barrier between an adjacent pair of stable positions in each channel means and second select current conductor means positioned between the first and the second channel means, wherein a magnetic bubble is switched across a barrier between two adjacent stable positions when predetermined coincident currents are driven through one of said first conductor means and said second conductor means.

13. A multi-state bubble memory cell as claimed in claim 12 which further includes a thin film soft magnetic material bar located between said bubble supporting material and each of said first conductor means to be magnetized by the current in the second conductor means to enhance switching of a bubble from one position to an adjacent position in one of the channel means.

14. A multi-state bubble memory cell as claimed in claim 13 which further includes bubble sensing means for detecting the presence of a bubble at the stable positions within the cell to determine the state of said cell.

15. A multi-state bubble memory cell as claimed in claim 13 wherein $m = 3$ and which further includes bubble sensing means located at the third stable position of each of the first and second channel means to detect the movement of a magnetic bubble into said third stable positions.

16. A multi-state bubble memory cell comprising:
a matrix of channels means formed in a bubble supporting material having stable magnetic bubble positions separated by barriers between adjacent stable positions located in said channel means to provide $(n+1)$ rows and $(p+1)$ columns of discrete energy minima positions, where $n$ may be equal to $p$; and
switching means having $n$ first select current conductor means, each of said first conductor means positioned over the barriers between the successive rows of energy minima positions and $p$ second select current conductor means; each of said second conductor means positioned over the barrier between the successive columns of energy minima positions, wherein a magnetic bubble is switched across a barrier between two adjacent stable positions when predetermined coincident currents are driven through one of said first conductor means and one of said second conductor means.

17. A multi-state bubble memory cell as claimed in claim 16 which further includes a thin film soft magnetic material pattern positioned on the bubble supporting material at the conductor means crossings to be magnetized by the currents in the conductor means to enhance switching of a magnetic bubble from one position to an adjacent position.

* * * * *